(12) United States Patent
Chen et al.

(10) Patent No.: US 7,085,686 B1
(45) Date of Patent: Aug. 1, 2006

(54) METHOD AND SYSTEM FOR CANCELING NOISE AND COMPRESSING DATA FROM A MOTOR PHASE ANGLE SENSOR

(75) Inventors: Yu-To Chen, Niskayuna, NY (US); Sharon Shihua Liu, Cupertino, CA (US); Vipin Kewal Ramani, Niskayuna, NY (US); Nicolas Wadih Chbat, Albany, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/262,934

(22) Filed: Mar. 5, 1999

(51) Int. Cl.
*G06F 15/00* (2006.01)

(52) U.S. Cl. .................. 702/194; 382/280; 382/291

(58) Field of Classification Search .............. 702/64, 702/66, 69, 70–72, 75, 77, 106, 111, 183, 702/188, 189, 190, 191, 194, 197, 199; 34/528; 318/799; 367/47–50; 382/280, 291
See application file for complete search history.

(56) References Cited

U.S. PATENT DOCUMENTS

| | | | |
|---|---|---|---|
| 5,006,778 A | * | 4/1991 | Bashark .................. 318/799 |
| 5,517,585 A | * | 5/1996 | Dowling .................. 382/291 |
| 5,596,546 A | * | 1/1997 | Wisecup .................. 367/47 |
| 5,899,005 A | * | 5/1999 | Chen et al. .................. 34/528 |
| 6,584,111 B1 | * | 6/2003 | Aweya et al. .................. 370/412 |

* cited by examiner

*Primary Examiner*—Marc S. Hoff
*Assistant Examiner*—Mohamed Charioui
(74) *Attorney, Agent, or Firm*—Jason K. Klindtworth; Jean K. Testa

(57) ABSTRACT

A method and system for canceling noise and compressing data from a motor phase angle sensor. In this invention, phase angle data is sampled at a first sampling rate to generate a sampled phase angle. The sampled phase angle signal is sub-sampled at a second sampling rate to generate a sub-sampled phase angle signal which is transformed by subtracting each of the sub-sampled data points of the sub-sampled signal from 90 degrees to generate a transformed signal. The transformed phase angle signal is then convoluted with a wavelet signal to generate a convoluted phase angle signal. Next, a phase angle range signal is generated by calculating the range between the largest and smallest convoluted data points within each of a plurality of segments of the convoluted signal. A moving average calculation is performed on the phase angle range signal to generate a moving average signal.

17 Claims, 10 Drawing Sheets

METHOD AND SYSTEM FOR CANCELING NOISE AND COMPRESSING DATA FROM A MOTOR PHASE ANGLE SENSOR

FIELD OF THE INVENTION

The present invention relates generally to signal processing, and more particularly to a system and method for noise cancellation and data compression.

BACKGROUND OF THE INVENTION

The phase angle of a clothes dryer motor is one parameter that may be use to predict the dryness of clothing articles being dried in the dryer. The motor phase angle can indicate how heavy the clothing articles are and hence how much water remains in the clothing articles being dried. The motor phase angle may be detected using an appropriate sensor that generates a signal representative of the motor's phase angle. However, accurate prediction of the clothing articles' dryness based on the motor phase angle signal can be affected by noise in the signal. Furthermore, the raw signal representative of the motor phase angle from the sensor may contain more data than can be efficiently used to determine an accurate prediction of the clothing articles' dryness.

SUMMARY OF THE INVENTION

In accordance with the present invention, there is provided a signal processing method. The method comprises a first step of sampling a continuous time process or signal at a first sampling rate to generate a sampled signal having a plurality of sampled data points. The sampled signal is next convoluted with an appropriate wavelet signal to generate a convoluted signal having a plurality of convoluted data points. A range signal having a plurality of range data points is next generated by determining the range between the smallest and largest valued convoluted data points within each of a plurality of segments of the convoluted signal. The method concludes with generating a moving average signal having a plurality of moving average data points by calculating the moving average of the range data points of the range signal.

In accordance with one aspect of the present invention, the sampled signal is sub-sampled at a second sampling rate to generate a sub-sampled signal having a plurality of sub-sampled data points. The sub-sampled signal is convoluted with the wavelet signal to generate the convoluted signal. In accordance with another aspect, the sampled signal is a phase angle signal receivable from a phase angle sensor that logs the phase angle of an electric device at the first sampling rate. Before the sampled signal is convoluted with the wavelet signal, the sampled signal is transformed by subtracting each of the sampled data points from 90 degrees. This generates a transformed phase angle signal having a plurality of transformed data points. The transformed motor angle signal is convoluted with the wavelet signal to generate the convoluted signal.

In the first embodiment of this present invention, a signal processing method begins with the step of logging phase angle data sampled at a first sampling rate to thereby generate a sampled phase angle signal. The phase angle data may, for example, be logged to a microprocessor by a motor phase angle sensor that detects the phase angle of a dryer motor. The sampled phase angle signal is sub-sampled at a second sampling rate to generate a sub-sampled phase angle signal. The sub-sampled phase angle signal is transformed by subtracting each of the sub-sampled data points of the sub-sampled signal from 90 degrees. The transforming step results in a transformed phase angle signal. The transformed phase angle signal is next convoluted with a wavelet signal to generate a convoluted phase angle signal. The wavelet signal may, for example, be a Lemaire wavelet signal. Next, the range between the largest and smallest convoluted data points within each of a plurality of segments of the convoluted signal is calculated to generate a phase angle range signal. Finally, a moving average calculation is performed on the phase angle range signal to generate a moving average signal. The moving average calculation may be a seven point moving average calculation and it may be performed twice. The method cancels both noise and compresses data in the sampled phase angle signal.

In the second embodiment of this invention, a signal processing system is provided. The system comprises a plurality of sampled data points and a microprocessor. The sampled data points comprise a signal to be processed. The microprocessor performs several operations, including a convolution operation, a range determining operation and a moving average operation. In the convolution operation, the sampled data points are convoluted with a plurality of wavelet data points comprising a wavelet signal to generate a plurality of convoluted data points. In the range determining operation, the range between the smallest and largest convoluted data point within each of a plurality of convoluted data point groups is determined. The range determining operation results in a plurality of range data points. In the moving average operation, the moving average of the range data points is calculated to generate a plurality of moving average data points. The moving average data points comprise a processed version of the signal comprised by the sampled data points in which both noise has been canceled and data compressed.

DETAILED DESCRIPTION

Figure 1:
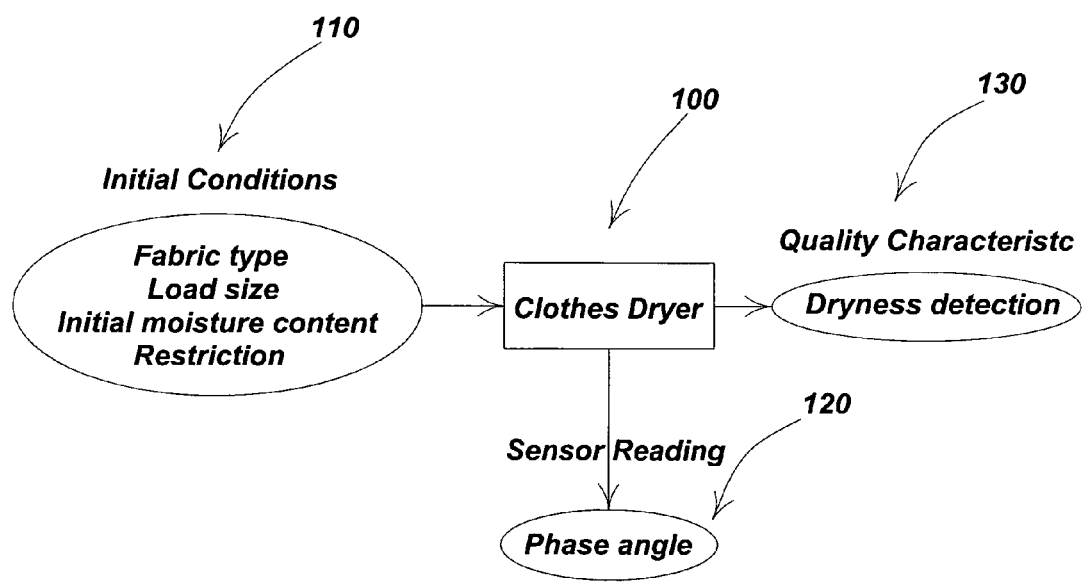
FIG. 1 shows a clothes dryer schematic.

A clothes dryer schematic is shown in FIG. 1. The clothes dryer 100 accepts initial conditions 110 of fabric type, load size, initial moisture content, and exhaust vent restriction. The clothes dryer 100 provides a motor phase angle sensor reading 120 and a quality characteristic 130, such as the dryness detection.

Figure 2:
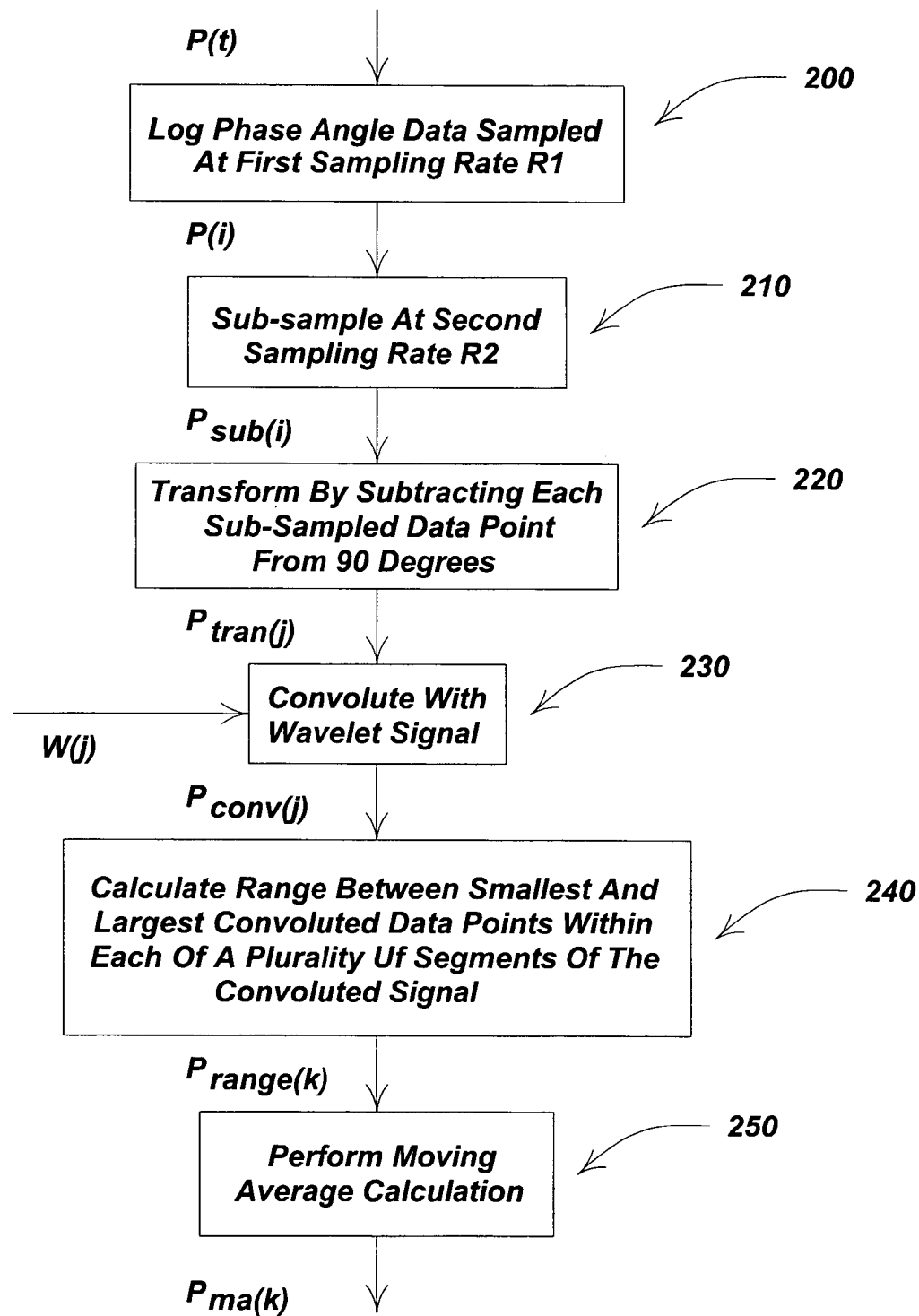
FIG. 2 shows a flow chart of one embodiment of the method of the present invention.
Figure 3:
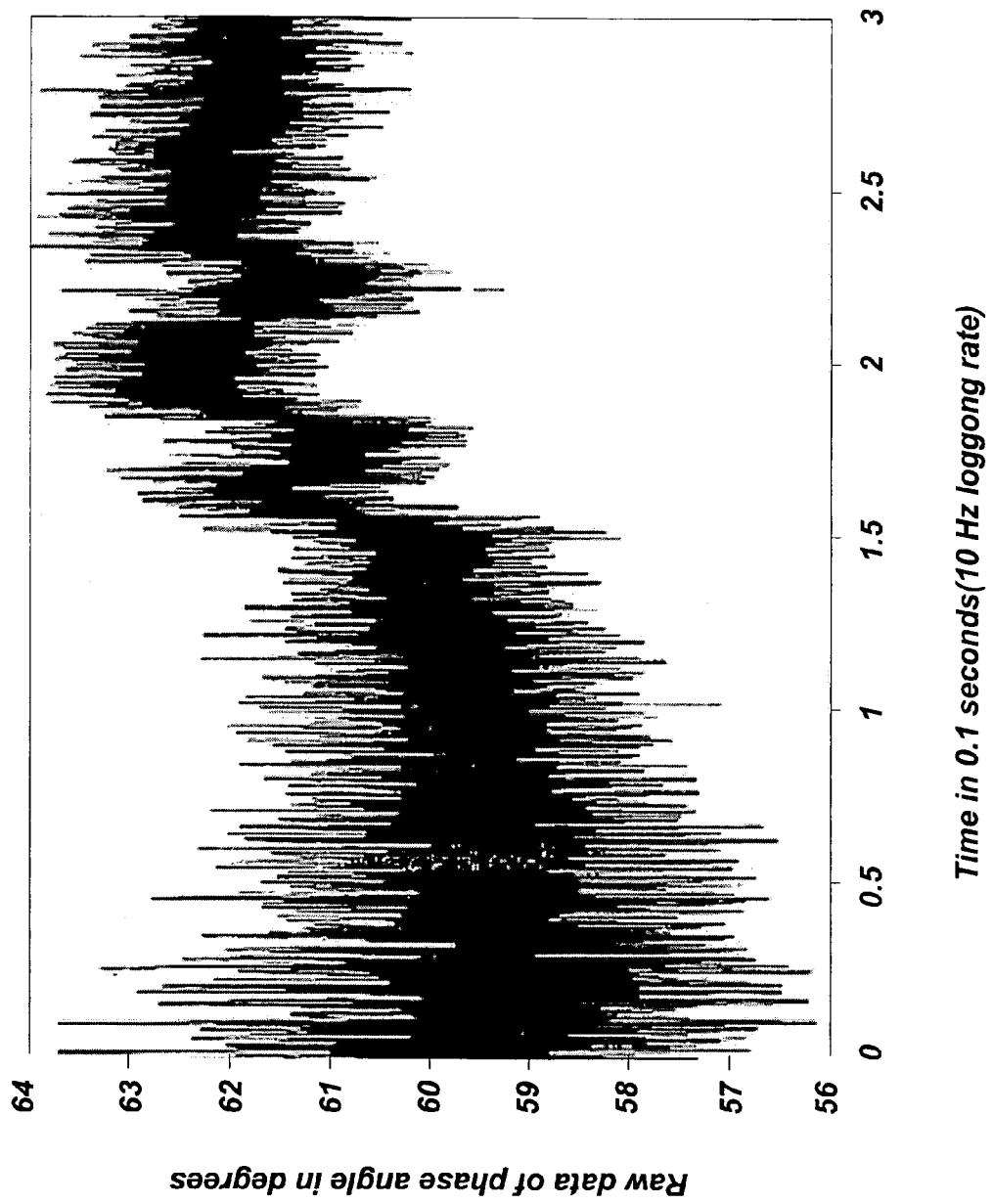
FIG. 3 shows a plot of a sampled signal P(i)

Referring to FIG. 2, the first embodiment of this invention provides a signal processing method. The first operation, indicated at 200, is to sample the motor phase angle sensor signal P(t) at first sampling rate R1 to generate a sampled phase angle signal P(i). The first sampling rate R1 is preferably between about 2 and 10 Hz, and more preferably is about 10 Hz. The sampled signal P(i) includes i sampled data points that indicate the detected phase angle at the discrete sample instances. FIG. 3 shows a sampled signal P(i) where the phase angle of a dryer motor has been sampled at a first sampling rate R1 of 10 Hz.

Figure 4:
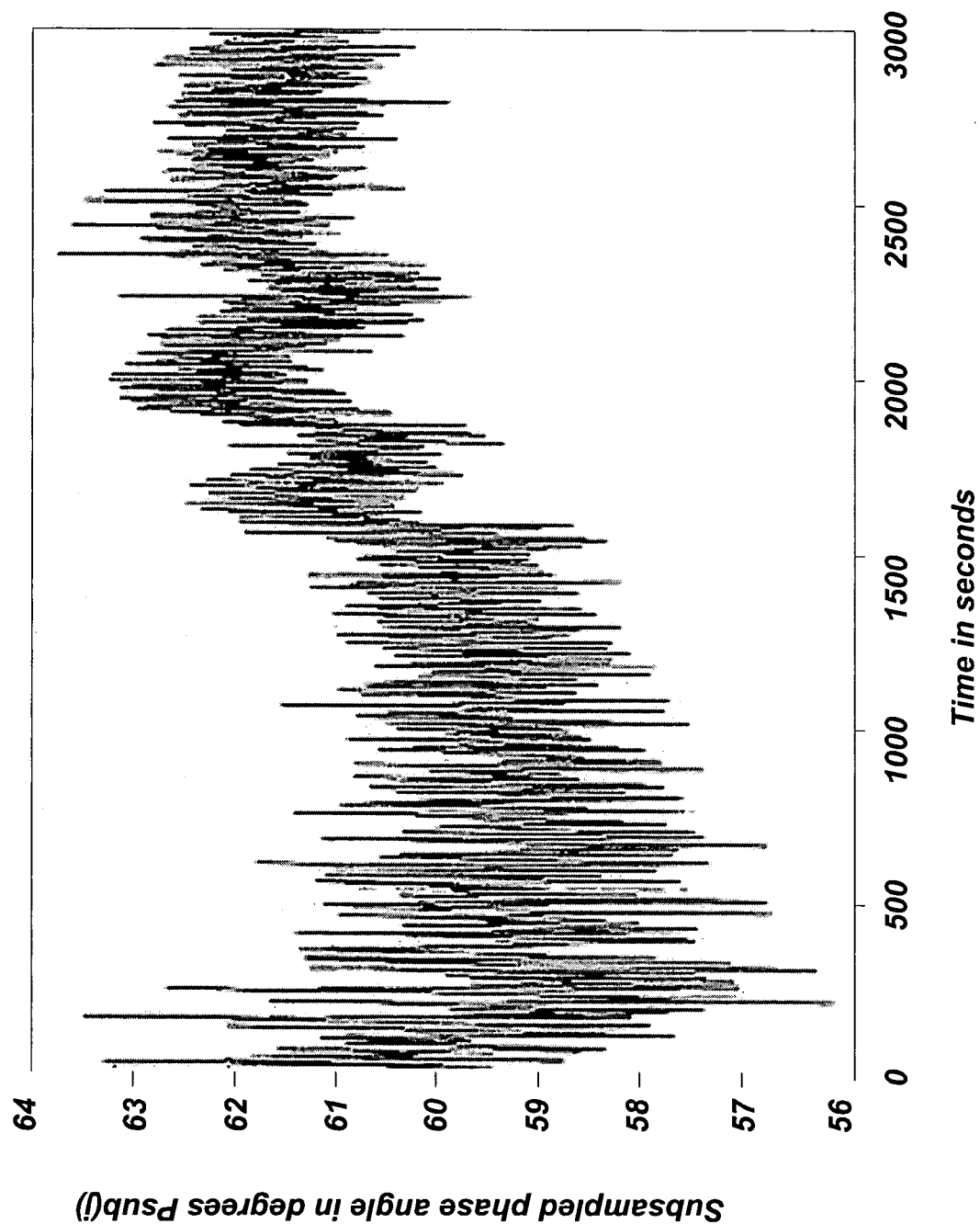
FIG. 4 shows a plot of a sub-sampled signal $P_{sub}(j)$.

The next operation, indicated at 210, is to sub-sample the sampled phase angle signal P(i) at a second sampling rate R2 to generate a sub-sampled signal denoted $P_{sub}(j)$ having j sub-sampled data points. The second sampling rate R2 is preferably less than the first sampling rate R1 so that the number of sub-sampled data points j, is less than the number of sampled data points i. The second sampling rate R2 is preferably between about 1 and 10 Hz, and more preferably is about 1 Hz. FIG. 4 shows a sub-sampled signal $P_{sub}(j)$ generated by sampling the sampled signal P(i) shown in FIG. 3 at a second sampling rate R2 of 1 Hz.

Figure 5:
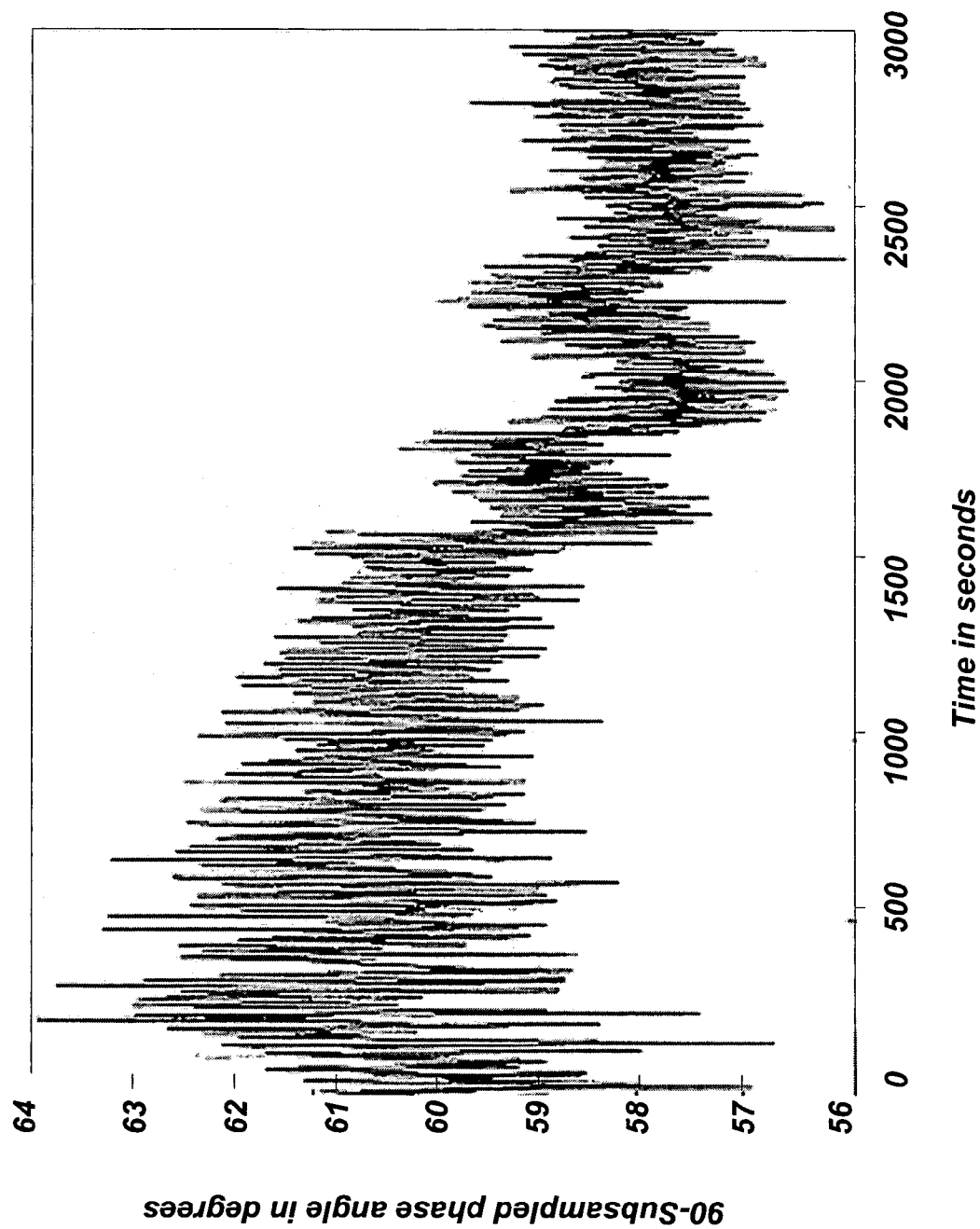
FIG. 5 shows a plot of a transformed signal $P_{tran}(j)$.

The next operation, indicated at 220, is to transform the sub-sampled signal $P_{sub}(j)$ by subtracting each of the sub-sampled data points from 90 degrees. As a result, a transformed signal $P_{tran}(j)$ is generated having j transformed data points. FIG. 5 shows the transformed signal $P_{tran}(j)$ resulting from subtracting 90 degrees from each of the sub-sampled data points of the sub-sampled signal $P_{sub}(j)$ shown in FIG. 4.

The next operation, indicated at 230, is to convolute the transformed signal $P_{tran}(j)$ with a wavelet signal denoted by W(j) to generate a convoluted signal $P_{conv}(j)$ having j convoluted data points. Preferably the wavelet signal W(j) is a Lemaire wavelet signal. More preferably, the wavelet signal W(j) is a Lemaire wavelet signal described by the following equation:

$$z = f(x,y) = \cos(2x) + \cos(2y) + \exp\{-[(x/a)^2 + (y/a)^2]\} \quad (1)$$

Figure 6:
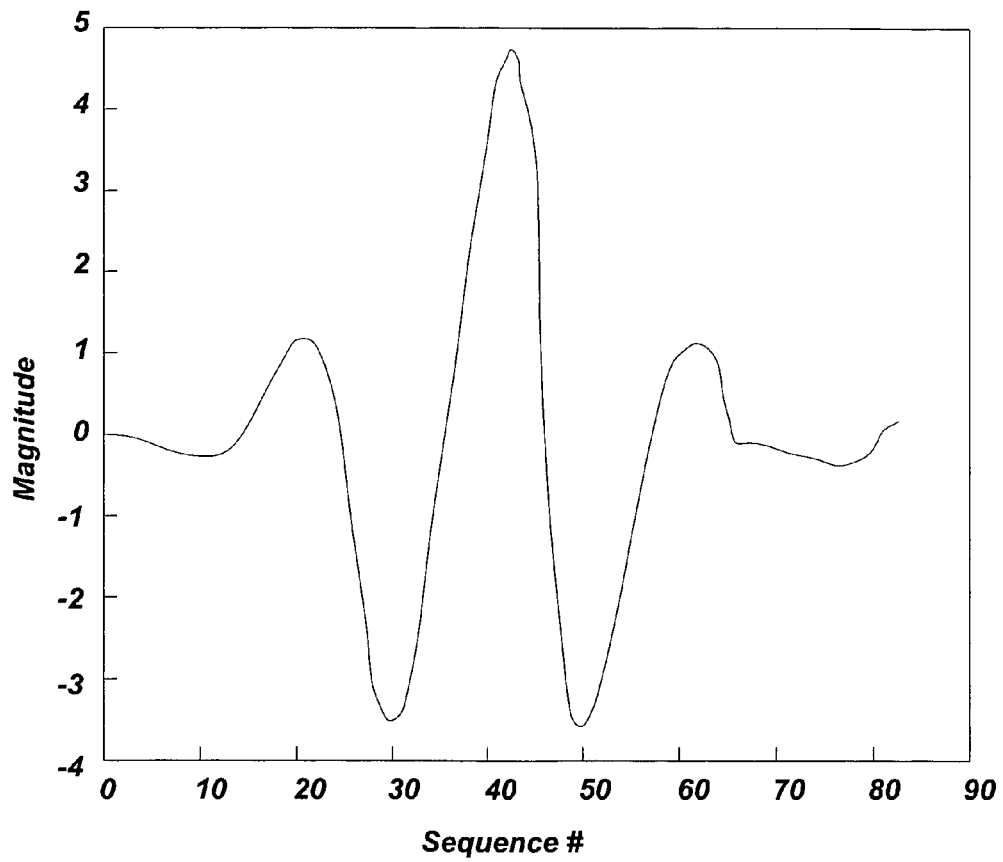
FIG. 6 shows a plot of a wavelet signal W(j)
Figure 7:
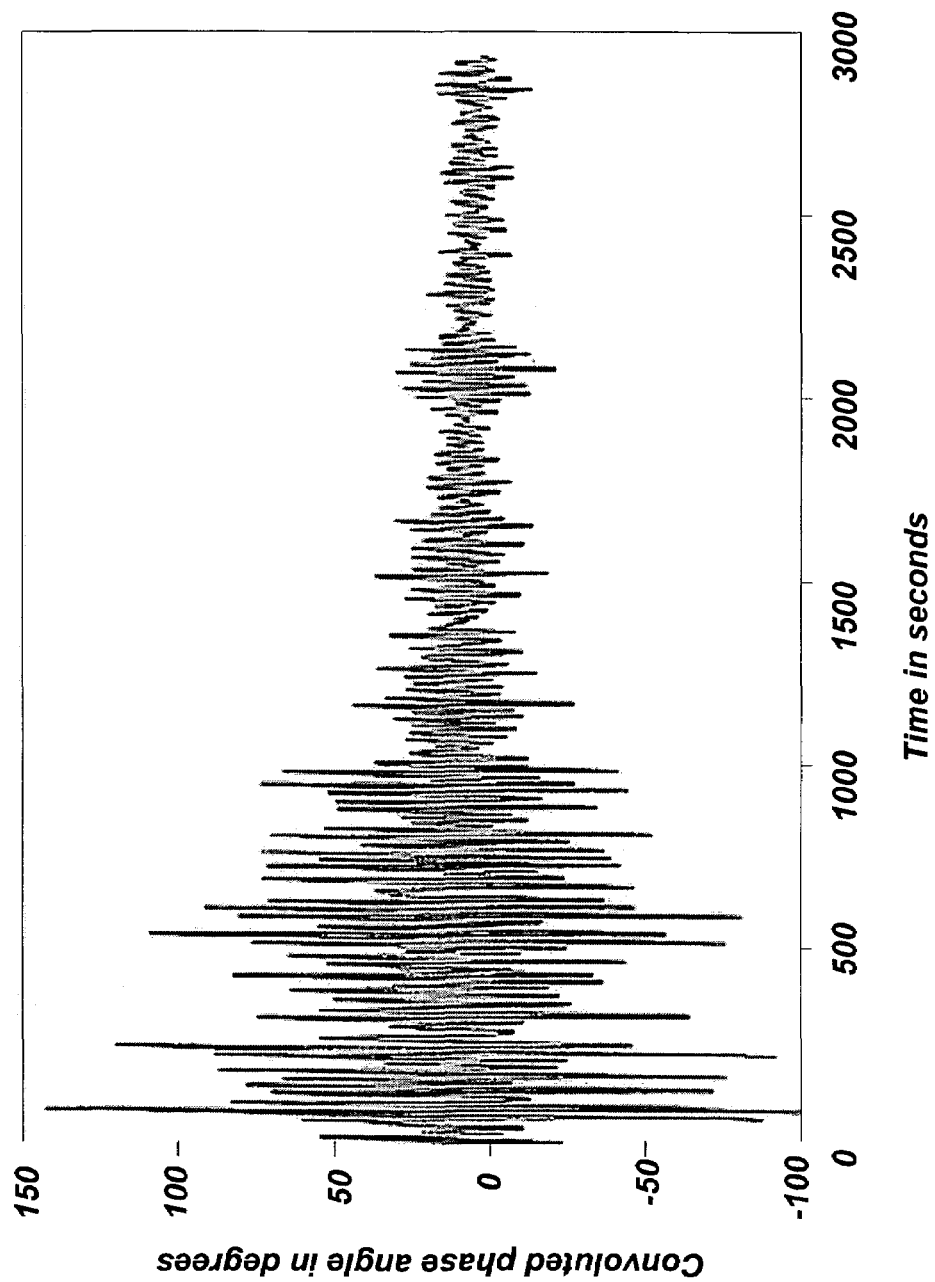
FIG. 7 shows a plot of a convoluted signal $P_{conv}(j)$.

FIG. 6 shows a wavelet signal W(j) described by equation (1) with scaling factor a=2, y=1, and x ranging from −5 to 5 in increments of 0.1. FIG. 7 shows the convoluted signal $P_{conv}(j)$ which is generated by convoluting the wavelet signal W(j) shown in FIG. 6 with the transformed signal $P_{tran}(j)$ shown in FIG. 5.

Figure 8:
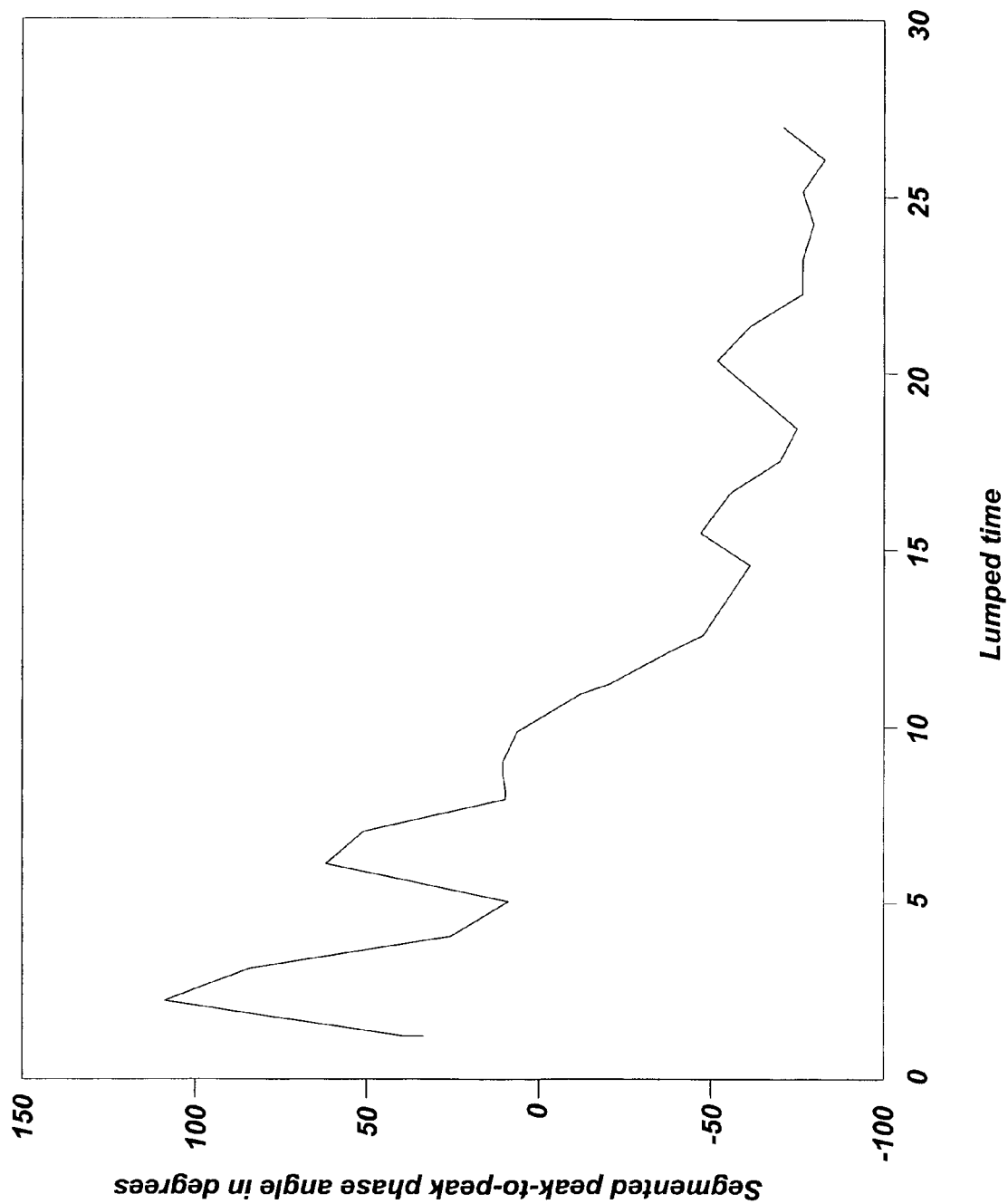
FIG. 8 shows a plot of a range signal $P_{range}(k)$.

After convoluting the transformed signal $P_{tran}(j)$ with the wavelet signal W(j), the next operation, indicated at 240, is to calculate the range between the smallest and largest convoluted data points within each of a plurality of segments of the convoluted signal $P_{conv}(j)$. With the possible exception of the final segment, each segment of the convoluted signal $P_{conv}(j)$ for which the range is calculated contains a predetermined number N of the convoluted data points. Preferably, N is between about 50 and 100, and, more preferably, N is about 100. The range calculating step generates a range signal $P_{range}(k)$ having k range data points, wherein k is an integer less than j and is approximated by the result of j divided by N. The last segment may have less than N convoluted data points where N is not a factor of j. For example if j equals 2950 and N is 100, there would be twenty-nine segments having 100 convoluted data points and the last segment with only 50 convoluted data points. FIG. 8 shows a range signal $P_{range}(k)$ calculated from the range between the smallest convoluted data point and largest convoluted data point within segments of the convoluted signal $P_{conv}(j)$ shown in FIG. 7, wherein each segment (except the last) contains 100 of the convoluted data points.

Figure 9:
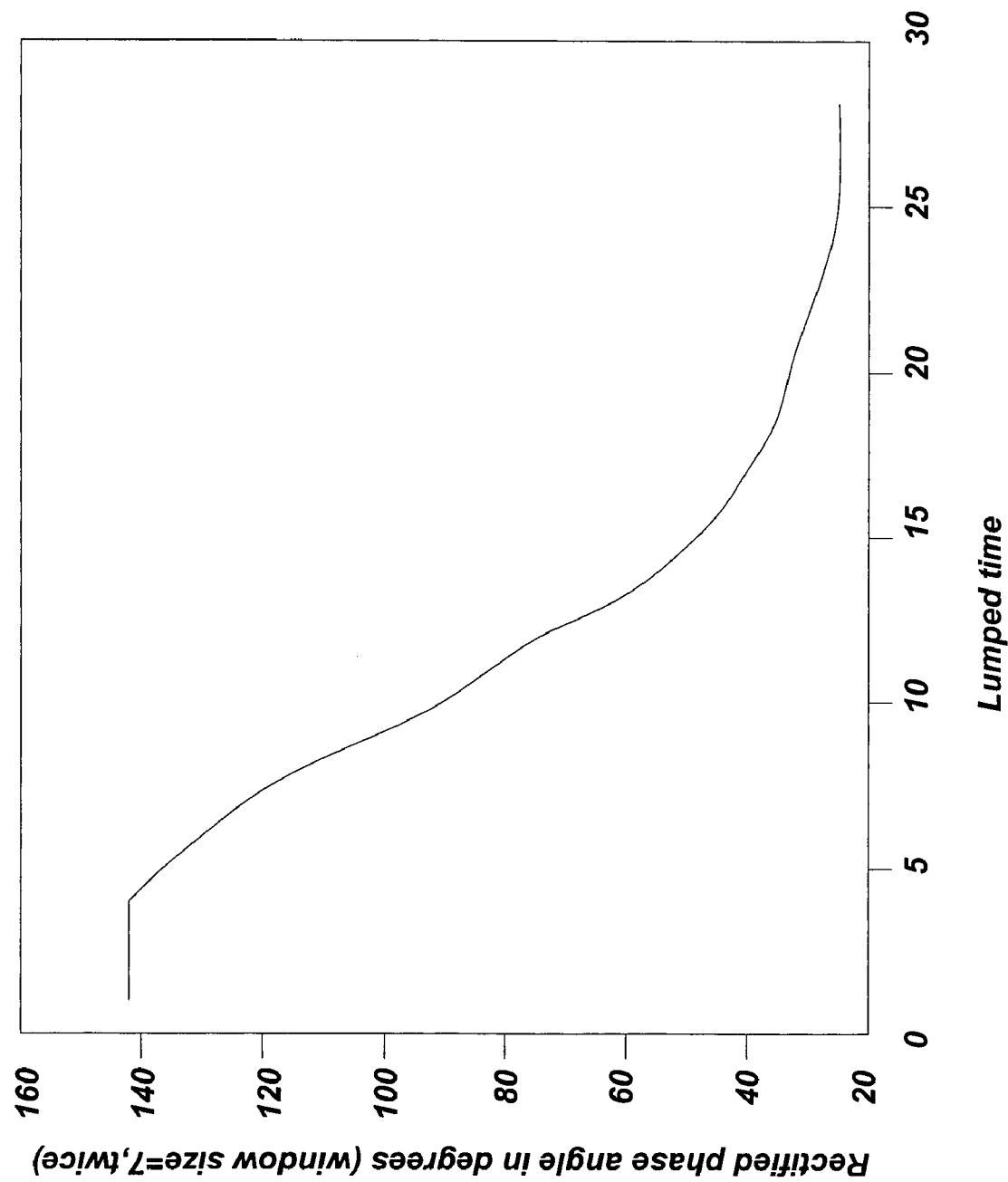
FIG. 9 shows a plot of a moving average signal $P_{ma}(k)$.

The last operation, indicated at 250, is to perform a moving average calculation on the range signal $P_{range}(k)$, which generates a moving average signal $P_{ma}(k)$ having k moving average data points. Preferably, the moving average calculation is performed twice to generate the moving average signal $P_{ma}(k)$. Also, the moving average calculation performed is preferably a seven point moving average calculation (i.e., the previous seven data points are considered in calculating the current data point). FIG. 9 shows a moving average signal $P_{ma}(k)$ generated by twice calculating a seven-point moving average on the range signal $P_{range}(k)$ shown in FIG. 8.

As can be seen by comparing FIGS. 3 and 9, noise and data in the sampled signal P(i) have both been respectively canceled and compressed in the processed signal $P_{ma}(k)$. Consequently, a more accurate prediction of the dryness characteristics of clothing articles based on the phase angle data is now possible.

Figure 10:
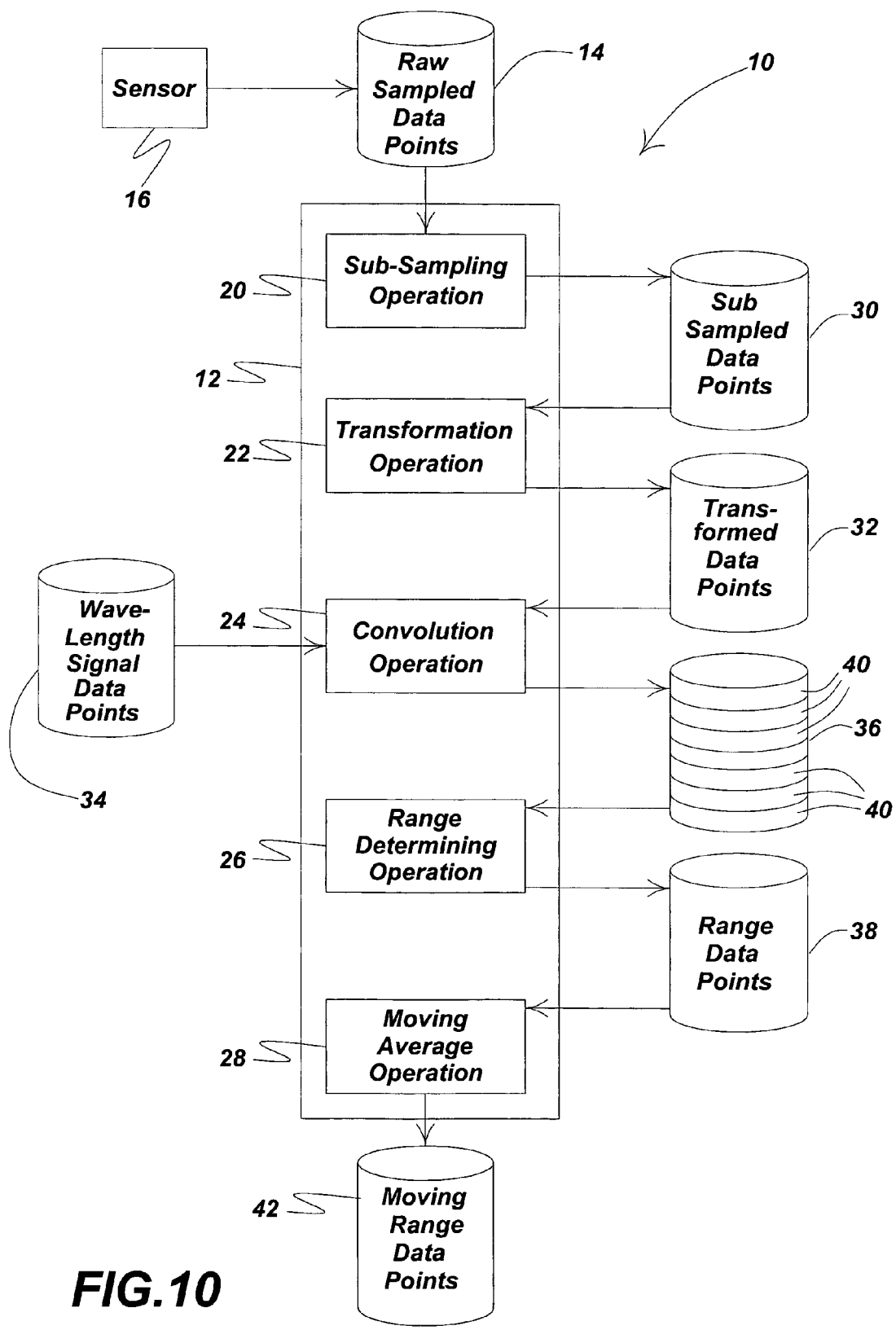
FIG. 10 shows a block diagram of one embodiment of the system of the present invention.

Referring now to FIG. 10, a second embodiment of the present invention is a signal processing system 10. The signal processing system 10 includes a microprocessor 12 and a plurality of raw sampled data points 14. The raw sampled data points 14 comprise a signal that is to be processed. The raw sampled data points 14 can be generated by a sensor 16 that detects a desired parameter and logs the desired parameter to the microprocessor 12. For example, the sensor 16 may be a motor phase angle sensor that detects the phase angle of a dryer motor and logs the detected phase angle to the microprocessor 12 at a first sampling rate. The microprocessor 12 is enabled through software, hardware and/or a combination of both for performing several operations 20–28 that process the raw data points 14 to effect both noise cancellation and data compression on the signal comprised by the raw sampled data points 14.

The first operation the microprocessor 12 performs is a sub-sampling operation 20 wherein the raw sampled data points 14 are sampled at a second sampling rate to generate a plurality of sub-sampled data points 30. The second sampling rate is preferably less than the first sampling rate so that the number of sub-sampled data points 30 is fewer than the number of raw sampled data points 14. For example, where the signal processing system 10 is included in a clothes dryer, the first sampling rate is preferably about 10 Hz and the second sampling rate is preferably about 1 Hz. The next operation the microprocessor 12 performs is a transformation operation 22, wherein each of the sub-sampled data points 30 are subtracted from 90 degrees. The transformation operation 22 results in a plurality of transformed data points 32. The microprocessor then performs a convolution operation 24 wherein the transformed data points 32 are convoluted with a plurality of wavelet signal data points 34. The convolution operation 24 generates a plurality of convoluted data points 36. The microprocessor 12 then performs a range determining operation 26 to generate a plurality of range data points 38. In the range determining operation 26, the microprocessor 12 determines the range between the smallest and largest convoluted data points 36 within each of a plurality of groups 40 of the convoluted data points 36. Each group 40 of the convoluted data points 36 contains a predetermined number N of the convoluted data points 36, although the last group may have fewer depending upon the total number of convoluted data points 36 and the size of N. For example, when the raw sampled data points 14 correspond with the phase angle of a clothes dryer motor, each group 40 (with the possible exception of the last) preferably contains 100 convoluted data points 36. The final operation performed by the microprocessor 12 is a moving average operation 28. The moving average operation 28 calculates the moving average of the range data points 38 to generate a plurality of moving average data points 42. The moving average data points 42 comprise a processed version of the signal comprised by the raw sampled data points 14. Preferably, the moving average operation 28 is performed twice to generate the moving average data points 42. Also, the moving average calculation performed is preferably a seven point moving average calculation.

The system 10 is typical of a system that may be incorporated into a clothes dryer and used for generating a processed motor phase angle signal that can be used to more accurately predict the dryness characteristics of clothing articles being dried in the clothes dryer like in the approach set forth in commonly assigned U.S. patent application Ser. No. 09/025,605, entitled SYSTEM AND METHOD FOR PREDICTING THE DRYNESS OF CLOTHING ARTICLES. It should be appreciated that the microprocessor 12 need not be enabled for performing both the sub-sampling and transformation operations 20, 22 in other applications of the signal processing system 10 of the present invention. For example, the sub-sampling operation 20 may not be necessary where the raw sampled data 14 is limited or where system resources permit completion of the convolution, range determining and moving average operations 24, 26 and 28 on a large number of raw sampled data points 14. The transformation operation 22 may not be necessary where the raw sampled data 14 does not represent the phase angle of a motor. In instances where the sub-sampling and transformation operations are not necessary, the convolution operation 24 may be performed directly on the raw sampled data 14 to generate the convoluted data points 36. Likewise, where the transformation operation 22 is not necessary, the sub-sampled data points 30 may be convoluted with the wavelet signal data points 34 to generate the convoluted data points 36. Similarly, where the sub-sampling operation 20 is not necessary, the transformation operation 22 can be performed directly on the raw sampled data points 14 to generate the transformed data points 32.

While various embodiments of the present invention have been described in detail, it is apparent that further modifications and adaptations of the invention will occur to those skilled in the art. However, it is expressly understood that such modifications and adaptations are within the spirit and scope of the present invention.

The invention claimed is:

1. A signal processing method comprising:
    logging phase angle data sampled at a first sampling rate to generate a sampled phase angle signal having a plurality of sampled data points;
    sub-sampling the sampled phase angle signal at a second sampling rate to generate a sub-sampled phase angle signal having a plurality of sub-sampled data points, the plurality of sub-sampled data points comprising a sub-set of the plurality of sampled data points;
    transforming the sub-sampled phase angle signal by subtracting each of the plurality of sub-sampled data points from 90 degrees to generate a transformed phase angle signal having a plurality of transformed data points, the plurality of transformed data points being equal in number to the plurality of sub-sampled data points;
    convoluting the transformed phase angle signal with a wavelet signal to generate a convoluted phase angle signal having a plurality of convoluted data points, the plurality of convoluted data points being equal in number to the plurality of transformed data points;
    calculating the range between the smallest and largest convoluted data point within each of a plurality of segments of the convoluted phase angle signal to generate a phase angle range signal having a plurality of phase angle range data points, the plurality of phase angle range data points being lesser in number than the plurality of convoluted data points; and
    performing a moving average calculation on the phase angle range signal to generate a moving average signal having a plurality of moving average data points, the plurality of moving average data points being equal in number to the plurality of phase angle range data points.

2. The signal processing method of claim 1 wherein the second sampling rate is about 1 Hz.

3. The signal processing method of claim 1 wherein the wavelet signal is a Lemaire wavelet signal.

4. The signal processing method of claim 1 wherein the sampled phase angle signal is a motor phase angle signal receivable from a motor phase angle sensor for detecting the phase angle of a dryer motor, and wherein the moving average signal is utilizable in predicting the dryness of clothing articles.

5. The signal processing method of claim 1 wherein the first sampling rate is between about 2 and 10 Hz.

6. The signal processing method of claim 1 wherein the first sampling rate is about 10 Hz.

7. The signal processing method of claim 1 wherein the second sampling rate is between about 1 and 10 Hz.

8. The signal processing method of claim 1 wherein in said calculating the range between the smallest and the largest convoluted data point within each of said plurality of segments, at least a subset of said segment, contains a predetermined number of the convoluted data points, the predetermined number being between about 50 and 100.

9. The signal processing method of claim 1 wherein in said calculating the range between the smallest and the largest convoluted data point within each of said plurality of segments, at least a subset of said segment, contains about 100 of the convoluted data points.

10. The signal processing method of claim 1 wherein in said performing a moving average calculation, the moving average calculation is performed twice to generate the moving average signal.

11. The signal processing method of claim 1 wherein in said performing a moving average calculation, the moving average calculation performed is a seven-point moving average calculation.

12. A signal processing system comprising:
    a plurality of sampled data points comprising a signal to be processed; and
    a microprocessor, said microprocessor being enabled for performing the following operations:
        sub-sampling said sampled data points at a second sampling rate to generate a plurality of sub-sampled data points; and
        subtracting each of the plurality of sub-sampled data points from 90 degrees to generate a plurality of transformed data points;
        convoluting said plurality of transformed data points with a plurality of wavelet data points comprising a wavelet signal to generate a plurality of convoluted data points;
        calculating the range between the smallest and largest convoluted data points within each of a plurality of groups of said convoluted data points to generate a plurality of range data points; and
    performing a moving average calculation on the range data points to generate a plurality of moving average data points;

wherein said moving average data points comprise a processed version of said signal in which both noise cancellation and data compression have been effected.

13. The signal processing system of claim 12 further comprising:
a motor phase angle sensor for detecting the phase angle of a motor and logging the detected phase angle to said microprocessor at a first sampling rate to thereby generate said sampled data points.

14. The signal processing system of claim 12 wherein said motor phase angle sensor and said microprocessor are included in a clothes dryer and said processed version of said signal is utilized in predicting the dryness of clothing articles.

15. A signal processing method comprising:
sampling a continuous time process at a first sampling rate to generate a sampled signal having a plurality of sampled data points;
sub-sampling the sampled signal at a second sampling rate to generate a sub-sampled signal having a plurality of sub-sampled data points, the second sampling rate being less than the first sampling rate so that the number of sub-sampled data points is fewer than the number of sampled data points;
convoluting the sub-sampled signal with a wavelet signal to generate a convoluted signal having a plurality of convoluted data points;
calculating the range between the smallest and largest convoluted data point within each of a plurality of segments of the convoluted signal to generate a range signal having a plurality of range data points; and
performing a moving average calculation on the range signal to generate a moving average signal having a plurality of moving average data points.

16. The signal processing method of claim 15 wherein the sampled signal is a phase angle signal receivable from a phase angle sensor that logs the phase angle of an electric device at the first sampling rate.

17. A signal processing method comprising:
sampling a continuous time process at a first sampling rate to generate a sampled signal having a plurality of sampled data points;
transforming the sampled phase angle signal by subtracting each of the plurality of sampled data points from 90 degrees to generate a transformed phase angle signal having a plurality of transformed data points;
convoluting the transformed chase angle signal with a wavelet signal to generate a convoluted signal having a plurality of convoluted data points;
calculating the range between the smallest and largest convoluted data point within each of a plurality of segments of the convoluted signal to generate a range signal having a plurality of range data points; and
performing a moving average calculation on the range signal to generate a moving average signal having a plurality of moving average data points.

\* \* \* \* \*